US009679957B2

(12) United States Patent
Kwon et al.

(10) Patent No.: US 9,679,957 B2
(45) Date of Patent: Jun. 13, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Sunja Kwon, Yongin-si (KR); Jieun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/078,795

(22) Filed: Mar. 23, 2016

(65) Prior Publication Data

US 2016/0307990 A1    Oct. 20, 2016

(30) Foreign Application Priority Data

Apr. 14, 2015 (KR) .................. 10-2015-0052456

(51) Int. Cl.
*H01L 27/32* (2006.01)
*H01L 27/12* (2006.01)
*H01L 51/52* (2006.01)

(52) U.S. Cl.
CPC ...... *H01L 27/3279* (2013.01); *H01L 27/3258* (2013.01); *H01L 51/5203* (2013.01); *H01L 27/124* (2013.01); *H01L 27/1248* (2013.01); *H01L 27/1259* (2013.01); *H01L 27/3288* (2013.01)

(58) Field of Classification Search
CPC ............ H01L 27/3279; H01L 27/3258; H01L 51/5203; H01L 27/124; H01L 27/1248; H01L 27/1259; H01L 27/3288
See application file for complete search history.

(56) References Cited

U.S. PATENT DOCUMENTS

| 7,439,539 | B2 * | 10/2008 | Jeoung | G02F 1/13458 257/59 |
|---|---|---|---|---|
| 7,663,311 | B2 * | 2/2010 | Im | H01L 27/3276 313/503 |
| 2010/0045918 | A1 * | 2/2010 | Han | G02F 1/1343 349/149 |
| 2013/0134424 | A1 | 5/2013 | Kim et al. | |
| 2014/0027726 | A1 | 1/2014 | Choi et al. | |
| 2014/0117316 | A1 | 5/2014 | Choi | |
| 2014/0327709 | A1 | 11/2014 | Hack et al. | |

FOREIGN PATENT DOCUMENTS

| KR | 10-2013-0060915 | 6/2013 |
|---|---|---|
| KR | 10-2014-0016111 | 2/2014 |
| KR | 10-2014-0057426 | 5/2014 |
| KR | 10-2014-0088942 | 7/2014 |
| KR | 10-2014-0093614 | 7/2014 |

* cited by examiner

*Primary Examiner* — Karen Kusumakar
(74) *Attorney, Agent, or Firm* — F. Chau & Associates, LLC

(57) ABSTRACT

An organic light-emitting display apparatus includes a substrate including a display area and a non-display area disposed on one side of the display area, a line unit including a plurality of lines extending in one direction and disposed on the substrate in the non-display area, an insulating film disposed on the line unit and exposing one end of the line unit, and a metal layer disposed between the line unit and the insulating film.

30 Claims, 11 Drawing Sheets

ORGANIC LIGHT-EMITTING DISPLAY APPARATUS AND METHOD OF MANUFACTURING THE SAME

CROSS-REFERENCE TO RELATED APPLICATIONS

This application claims priority under 35 U.S.C. §119 to Korean Patent Application No. 10-2015-0052456, filed on Apr. 14, 2015, the disclosure of which is incorporated by reference herein in its entirety.

TECHNICAL FIELD

Exemplary embodiments of the inventive concept relate to an organic light-emitting display apparatus and a method of manufacturing the same, and more particularly, to an organic light-emitting display apparatus having a reduced short defect between fan-out lines and a method of manufacturing the same.

DISCUSSION OF THE RELATED ART

Since organic light-emitting display apparatuses have broad viewing angles, good contrast, and fast response times, the use of organic light-emitting display apparatuses is increasing. In an organic light-emitting display apparatus, a plurality of thin film transistors (TFTs) and a plurality of organic light-emitting devices are formed on a lower substrate, and the organic light-emitting devices self-emit light. The organic light-emitting display apparatus may be used as a display of a small product such as, for example, a portable terminal and as a display of a large product such as, for example, a TV.

The organic light-emitting display apparatus includes a substrate having a display area and a pad area outside the display area. A plurality of organic light-emitting devices that are connected between scan lines and data lines in a matrix manner to form pixels are formed in the display area of the substrate. A scan driving unit and a data driving unit that process and supply signals provided from outside the organic light-emitting display apparatus through an input pad and scan lines and data lines are formed in the pad area. The scan driving unit and the data driving unit each include a driving circuit that processes signals provided from outside the organic light-emitting display apparatus to respectively generate scan signals and data signals. The driving circuit is formed during a manufacturing process of the organic light-emitting devices or manufactured as a separate driving circuit chip and then mounted on the substrate.

The organic light-emitting display apparatus forms a display apparatus by coating a material layer on the substrate and etching the material layer in a desired pattern during a process of forming thin film transistors, organic light-emitting devices, and various lines connected to the thin film transistors and the organic light-emitting devices. During this process, the material layer is etched in the desired pattern after the material layer is coated on the display area and the entire substrate.

SUMMARY

Exemplary embodiments of the inventive concept include an organic light-emitting display apparatus having a reduced short defect between adjacent fan-out lines, and a method of manufacturing the same.

According to an exemplary embodiment of the inventive concept, an organic light-emitting display apparatus includes a substrate including a display area and a non-display area disposed on one side of the display area, a line unit including a plurality of lines extending in one direction and disposed on the substrate in the non-display area, an insulating film disposed on the line unit and exposing one end of the line unit, and a metal layer disposed between the line unit and the insulating film.

In an exemplary embodiment, the metal layer is disposed on each of the plurality of lines in an island shape.

In an exemplary embodiment, the organic light-emitting display apparatus includes a first pad unit disposed on the one end of the line unit and a second pad unit disposed on another end of the line unit.

In an exemplary embodiment, the first pad unit is electrically connected to a driving circuit chip, and the second pad unit is electrically connected to a flexible printed circuit board.

In an exemplary embodiment, the insulating film includes an organic insulating material.

In an exemplary embodiment, the organic light-emitting display apparatus includes a thin film transistor disposed on the substrate in the display area, and a pixel electrode electrically connected to the thin film transistor. The metal layer and the pixel electrode include a first same material.

In an exemplary embodiment, the organic light-emitting display apparatus includes a pixel-defining layer covering the pixel electrode (e.g., an edge of the pixel electrode) and exposing a center portion of the pixel electrode. The insulating film and the pixel-defining layer include a second same material.

According to an exemplary embodiment of the inventive concept, an organic light-emitting display apparatus includes a substrate including a display area, a non-display area disposed on one side of the display area, a pad area formed in a center portion of the non-display area, and a fan-out area disposed in the non-display area. The pad area is disposed between the display area and the fan-out area. The organic light-emitting display apparatus further includes a line unit including a plurality of lines disposed on the substrate in the fan-out area and extending in one direction, a first insulating film disposed in a portion of the non-display area that excludes the fan-out area and the pad area, and a second insulating film disposed on the line unit and exposing one end of the line unit.

In an exemplary embodiment, the organic light-emitting display apparatus includes a metal layer disposed between the line unit and the second insulating film.

In an exemplary embodiment, the metal layer is disposed on each of the plurality of lines in an island shape.

In an exemplary embodiment, the organic light-emitting display apparatus includes a thin film transistor disposed on the substrate in the display area, and a pixel electrode electrically connected to the thin film transistor. The metal layer and the pixel electrode include a first same material.

In an exemplary embodiment, the organic light-emitting display apparatus further includes a pixel-defining layer covering an edge of the pixel electrode and exposing a center portion of the pixel electrode. The second insulating film and the pixel-defining layer include a second same material.

In an exemplary embodiment, the organic light-emitting display apparatus further includes a planarization layer disposed between the thin film transistor and the pixel electrode. The first insulating film and the planarization layer include a second same material.

In an exemplary embodiment, the thin film transistor includes a semiconductor layer, a gate electrode, a source electrode, and a drain electrode, and the line unit and the drain electrode or the source electrode include a second same material.

In an exemplary embodiment, the organic light-emitting display apparatus includes a first pad unit disposed on the one end of the line unit and a second pad unit disposed on another end of the line unit.

In an exemplary embodiment, the first pad unit is electrically connected to a driving circuit chip, and the second pad unit is electrically connected to a flexible printed circuit board.

In an exemplary embodiment, the first and second insulating films include an organic insulating material.

According to an exemplary embodiment of the inventive concept, a method of manufacturing an organic light-emitting display apparatus includes forming a plurality of lines extending in one direction on a substrate in a fan-out area of the substrate. The substrate includes a display area, a non-display area disposed on one side of the display area, the fan-out area disposed in the non-display area, a pad area formed in a center portion of the non-display area and disposed between the display area and the fan-out area, and a surrounding area disposed in a portion of the non-display area that excludes the pad area and the fan-out area. The method further includes forming a first insulating film on the substrate in the surrounding area. The plurality of lines formed in the fan-out area is exposed from the first insulating layer. The method further includes forming a metal layer on each of the plurality of lines, and forming a second insulating film on the metal layer. The second insulating film covers the plurality of lines and exposes one end of each of the plurality of lines in the pad area.

In an exemplary embodiment, forming the first insulating film includes coating a first insulating material layer on the substrate, and removing the first insulating material layer formed in the pad area and the fan-out area.

In an exemplary embodiment, forming the metal layer includes forming the metal layer on each of the plurality of lines in an island shape.

In an exemplary embodiment, forming the second insulating film includes coating a second insulating material layer on the substrate covering the metal layer, the plurality of lines, and the first insulating film, and removing the second insulating material layer formed in the pad area and the surrounding area.

In an exemplary embodiment, the method further includes forming a thin film transistor in the display area, and forming a pixel electrode electrically connected to the thin film transistor. Forming the metal layer is performed at substantially a same first time as forming the pixel electrode.

In an exemplary embodiment, the method further includes forming a pixel-defining layer covering an edge of the pixel electrode and exposing a center portion of the pixel electrode. Forming the second insulating film is performed at substantially a same second time as forming the pixel-defining layer.

In an exemplary embodiment, the method further includes forming a planarization layer subsequent to forming the thin film transistor and prior to forming the pixel electrode. Forming the first insulating film is performed at substantially a same time as forming the planarization layer.

In an exemplary embodiment, forming the thin film transistor includes forming a semiconductor layer, forming a gate electrode, and forming a source electrode and a drain electrode electrically connected to the semiconductor layer. Forming the plurality of lines is performed at substantially a same time as forming the source electrode or the drain electrode.

In an exemplary embodiment, the method further includes electrically connecting the one end of each of the plurality of lines to a driving circuit chip, and electrically connecting another end of each of the plurality of lines to a flexible printed circuit board.

In an exemplary embodiment, the first and second insulating films include an organic insulating material.

According to an exemplary embodiment of the inventive concept, a method of manufacturing an organic light-emitting display apparatus includes forming a line unit including a plurality of lines extending in one direction in a non-display area of a substrate. The substrate includes a display area and the non-display area disposed on one side of the display area. The method further includes forming an insulating film on the line unit. The insulating film exposes one end of the line unit. The method further includes forming a metal layer disposed between the line unit and the insulating film.

In an exemplary embodiment, the method further includes forming a thin film transistor on the substrate in the display area, and forming a pixel electrode electrically connected to the thin film transistor. The metal layer and the pixel electrode include a first same material.

In an exemplary embodiment, the method further includes forming a pixel-defining layer. The pixel-defining layer covers an edge of the pixel electrode and exposes a center portion of the pixel electrode. The insulating film and the pixel-defining layer include a second same material.

Exemplary embodiments of the inventive concept may be implemented using, for example, a system, a method, a computer program, or a combination of the system, the method, and the computer program.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
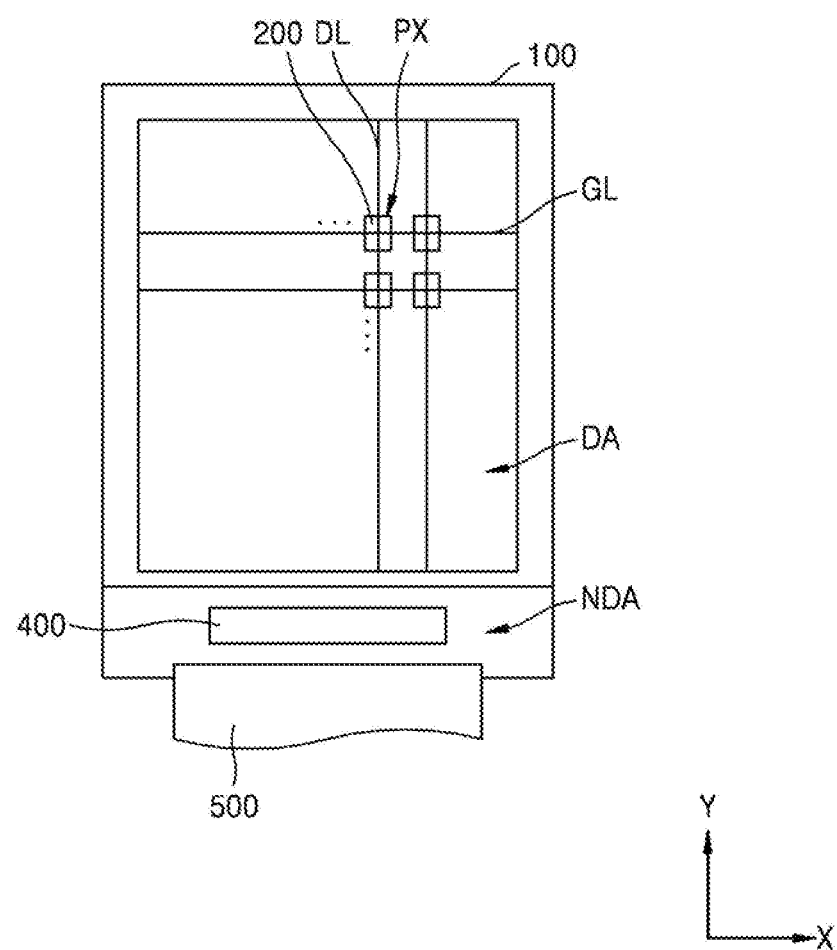
FIG. 1 is a plan view schematically illustrating an organic light-emitting display apparatus according to an exemplary embodiment of the inventive concept.

Exemplary embodiments of the inventive concept will be described more fully hereinafter with reference to the accompanying drawings. In the drawings, the size and relative sizes and thicknesses of layers and regions may be exaggerated for clarity. Like reference numerals may refer to like elements throughout the accompanying drawings.

It will be understood that although the terms "first", "second", etc. may be used herein to describe various components, these components should not be limited by these terms. These components are only used to distinguish one component from another. Thus, a "first" element in an exemplary embodiment may be described as a "second" element in another exemplary embodiment. The terms of a singular form may include plural forms unless the context clearly indicates otherwise.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, when two processes are described as being performed simultaneously or at substantially the same time as each other, it is to be understood that the processes may be performed at exactly the same time or at about the same time as would be understood by a person having ordinary skill in the art. Further, when a first area is described as surrounding a second area, it is to be understood that the first area may entirely or partially surround the second area.

Figure 2:
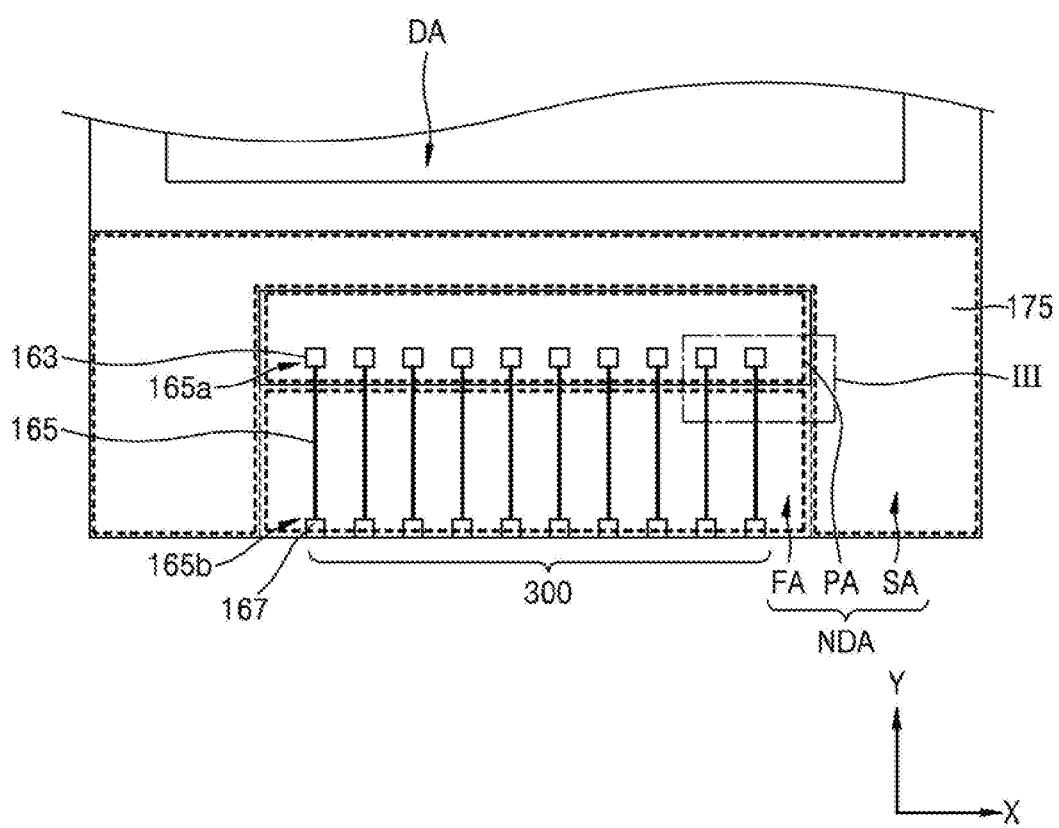
FIG. 2 is an enlarged plan view illustrating a pad area of FIG. 1 according to an exemplary embodiment of the inventive concept.
Figure 3:
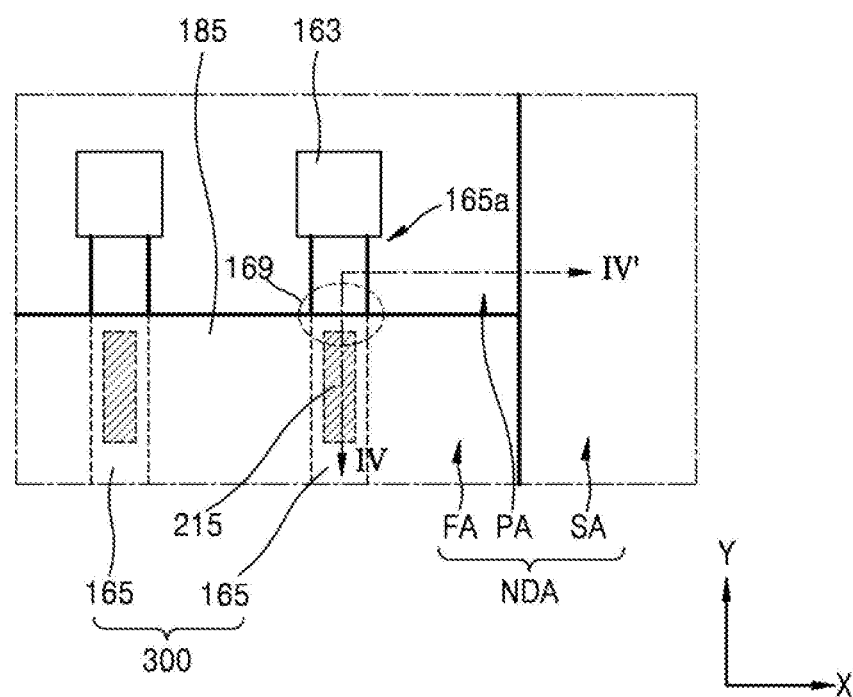
FIG. 3 is an enlarged plan view illustrating a region III of FIG. 2 according to an exemplary embodiment of the inventive concept.

FIG. 1 is a plan view schematically illustrating an organic light-emitting display apparatus according to an exemplary embodiment of the inventive concept. FIG. 2 is an enlarged plan view illustrating a pad area PA of FIG. 1 according to an exemplary embodiment of the inventive concept. FIG. 3 is an enlarged plan view illustrating a region III of FIG. 2 according to an exemplary embodiment of the inventive concept.

Referring to FIGS. 1 through 3, the organic light-emitting display apparatus according to an exemplary embodiment may include a substrate 100 including a display area DA and a non-display area NDA disposed on one side of the display area DA, an organic light-emitting device OLED 200 disposed in the display area DA, a line unit 300 disposed in the non-display area NDA, a first insulating film 175 disposed in a portion of the non-display area NDA that excludes the line unit 300, a second insulating film 185 disposed on the line unit 300, and a metal layer 215 disposed on fan-out lines 165 of the line unit 300.

The substrate 100 may include the display area DA in which an image is displayed and the non-display area NDA in which an image is not displayed. The non-display area may be disposed on one side of the display area DA. A plurality of pixels PX may be disposed in the display area DA. Signal lines may include gate lines GL extending in a first direction (e.g., the X axis direction) and data lines DL extending in a second direction (e.g., the Y axis direction). The pixels PX may be disposed in an area in which the gate lines GL and the data lines DL cross each other.

The gate lines GL may include a previous scan line, a light-emitting control line, etc. However, the gate lines GL are not limited thereto. The gate lines GL may be connected to a gate driving unit or a light-emitting control driving unit to receive a scan signal or a light-emitting control signal. In this regard, the types of signal lines included in the above-described gate lines GL, the types of signals transmitted by the signal lines, the types, number, and locations of driving units to which the signal lines are connected, etc. are not limited thereto, and may be applied and modified in various ways according to exemplary embodiments having different designs.

The data lines DL may be connected to a driving circuit chip 400 mounted in the non-display area NDA through a pad and a fan-out line. The data lines DL may receive a data signal from the driving circuit chip 400 through the fan-out line.

As described above, the pixels PX may be disposed in the area in which the gate lines GL and the data lines DL cross each other. The pixels PX may emit, for example, red, green, or blue light. However, the pixels PX are not limited thereto. For example, the pixels PX may emit white light.

Figure 5:
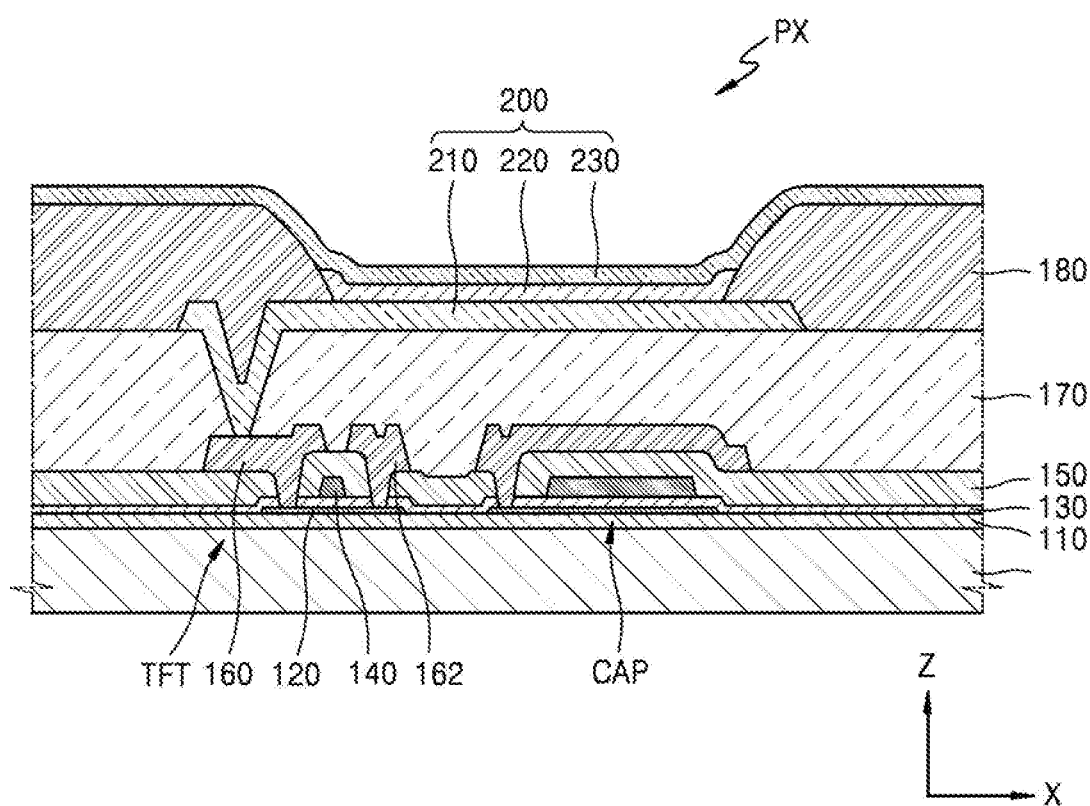
FIG. 5 is a schematic cross-sectional view of a part of a display area of FIG. 1 according to an exemplary embodiment of the inventive concept.

The pixels PX may include the organic light-emitting device OLED 200 that emits light at a brightness corresponding to a driving current corresponding to the data signal and a pixel circuit (or a driving circuit), which controls the driving current flowing through the organic light-emitting device OLED 200. The pixel circuit may be connected to each of the gate lines GL and the data lines DL. The organic light-emitting device OLED 200 may be connected to the pixel circuit. The pixel circuit may include at least one thin film transistor TFT and a capacitor CAP, as shown in FIG. 5.

Referring to the non-display area NDA, no images are displayed in this area, and various members and other modules for driving the organic light-emitting display apparatus may be mounted thereon. For example, a center portion of the non-display area NDA may include the pad area PA on which the driving circuit chip 400 is mounted, a fan-out area FA which is disposed opposite to the display area DA with respect to the pad area PA (e.g., the pad area PA is disposed between the display area DA and the fan-out area FA) and includes the fan-out lines 165 electrically connected to a flexible printed circuit board (FPCB) 500, and a surrounding area SA surrounding the pad area PA and the fan-out area FA.

The substrate 100 may be formed of various materials such as, for example, a glass material, a metal material, or plastic materials such as polyethylene terephthalate (PET), polyethylene naphthalate (PEN), polyimide, etc. However, the substrate 100 is not limited thereto.

Referring to FIG. 2, the line unit 300 may be disposed in the fan-out area FA of the non-display area NDA and may include the fan-out lines 165. The fan-out lines 165 may be disposed in one direction (e.g., the Y axis direction) and may extend to the outside of the substrate 100.

One end 165a of the line unit 300 may extend to the pad area PA. The one end 165a of the line unit 300 refers to the ends 165a of the plurality of fan-out lines 165 of the line unit 300. Thus, one end 165a of each of the plurality of fan-out lines 165 may extend to the pad area PA. A first pad unit 163 may be disposed on the one end 165a of the line unit 300. Another end 165b of the line unit 300 may extend to the outside of the substrate 100. A second pad unit 167 may be disposed on and connected to the other end 165b of the line unit 300. The first pad unit 163 may be a part to which a connection terminal of the driving circuit chip 400 is electrically connected. The second pad unit 167 may be a part to which a connection terminal of the FPCB 500 is electrically connected. The first pad unit 163 and the second pad unit 167 may extend from the fan-out lines 165 and may connect the fan-out lines to the driving circuit chip 400 and the FPCB 500.

The line unit 300 may be formed of the same material as that of a source electrode (see 160 of FIG. 5) of the thin film transistor TFT or a drain electrode (see 162 of FIG. 5) that will be described in further detail below. Thus, according to exemplary embodiments, the line unit 300 is formed simultaneously with a source electrode 160 and a drain electrode 162 of the thin film transistor TFT. That is, according to exemplary embodiments, the line unit 300 and the source and drain electrodes 160 and 162 of the thin film transistor TFT are formed at substantially the same time.

The first insulating film 175 may be disposed in a portion of the non-display area NDA that excludes the fan-out area FA and the pad area PA. For example, the first insulating film 175 may be formed in the surrounding area SA of the non-display area NDA. The first insulting film 175 may include the same material as that of a planarization layer (see 170 of FIG. 5) formed in the display area DA, which will be described further below. Thus, the first insulating film 175 may be patterned after being formed on the entire substrate 100 over the display area DA and the non-display area NDA. The first insulating film 175 may be formed of an organic insulating material and may insulate various structures disposed in the surrounding area SA from the outside.

The second insulating film 185 may be disposed in the fan-out area FA in which the line unit 300 is disposed. That is, the second insulating film 185 may be disposed on the line unit 300 and may cover the line unit 300, and may expose the one end 165a of the line unit 300 on which the first pad unit 163 is disposed. For example, the one end 165a of the line unit 300 may be exposed from the second insulating film 185, allowing for the first pad unit 163 to be disposed on and connected to the one end 165a. The second insulating film 185 may include the same material as that of a pixel-defining layer (see 180 of FIG. 5) formed in the display area DA, which will be described further below. Thus, the second insulating film 185 may be patterned after being formed on the entire substrate 100 over the display area DA and the non-display area NDA. The second insulating film 185 may be formed of an organic insulating material and may insulate the line unit 300 from the outside.

The first insulating film 175 may be disposed in the surrounding area SA of the non-display area NDA, the second insulating film 185 may be disposed in the fan-out area FA of the non-display area NDA, and the first insulating film 175 and the second insulating film 185 may not be disposed in the non-display area NDA and the pad area PA. The pad area PA is an open area in which the first insulating film 175 and the second insulating film 185 are not disposed. The one end 165a of the fan-out lines 165 and the first pad unit 163 extending from the one end 165a of the fan-out lines 165 may be exposed to the outside.

The metal layer 215 may be disposed on each of the fan-out lines 165 included in the line unit 300. As shown in FIG. 3, the metal layer 215 may be disposed on each of the fan-out lines 165 in an island type. For example, the metal layer 215 may have an island shape that is disposed on each of the fan-out lines 165 such that the metal layer 215 is disposed within the border of the fan-out lines 165. That is, the edges/sides of the island-shaped metal layer 215 may be disposed within the fan-out lines 165 without contacting the edges/sides of the fan-out lines 165 (e.g., a space may exist between each edge/side of the metal layer 215 and each edge/side of the fan-out lines 165 in a plan view). The metal layer 215 may have, for example, a rectangular island shape. However, the metal layer 215 is not limited thereto. The metal layer 215 may include the same material as that of a pixel electrode (see 210 of FIG. 5) formed in the display area DA, which will be described further below. Thus, the metal layer 215 may be formed after forming a material used to form the pixel electrode 210 on the entire substrate 100 over the display area DA and the non-display area NDA, patterning the material and retaining a pattern of the pixel electrode 210 and various patterns such as the metal layer 215, and etching an unnecessary portion. The metal layer 215 may be disposed on each of the fan-out lines 165, which may increase the thicknesses of the fan-out lines 165, which are designed to have small widths, thereby reducing the resistance of the fan-out lines 165.

The driving circuit chip 400 may include a data driving unit that supplies the data signal to the data lines DL and various function units used to drive the display area DA. The driving circuit chip 400 may be mounted on the substrate 100 using, for example, chip-on-glass (COG) mounting. A connection terminal electrically connected to pads including the first pad unit 163 formed on the substrate 100 may be disposed on one side of the driving circuit chip 400. A conductive ball may be disposed between the pads and the connection terminal to bond the pads and the connection terminal using, for example, an electrically connectable adhesive material interposed therebetween. For example, an anisotropic conductive film, a self organizing conductive film, etc. may be used as the adhesive material. However, the adhesive material is not limited thereto.

Figure 4:
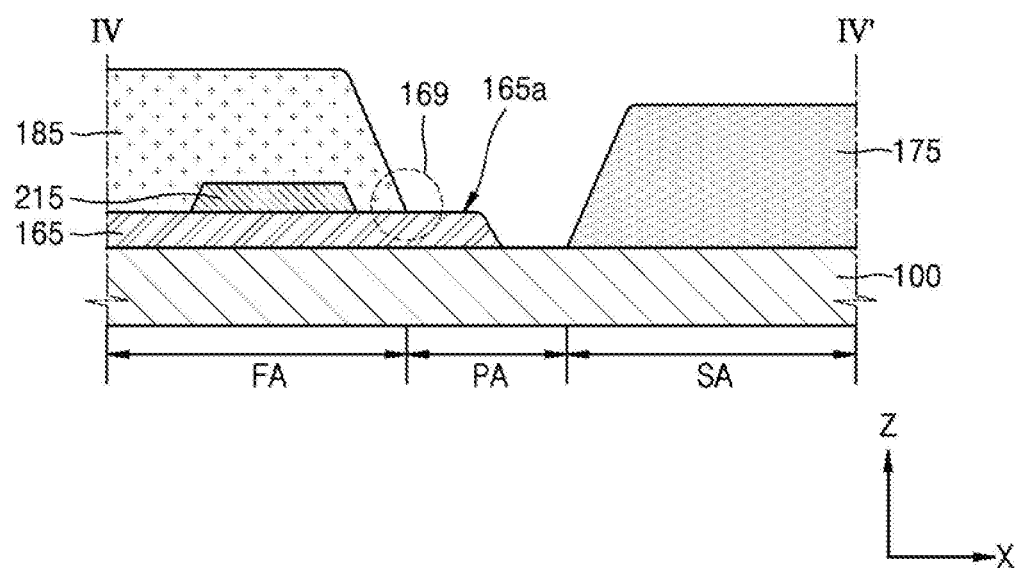
FIG. 4 is a schematic cross-sectional view taken along line IV-IV' of FIG. 3 according to an exemplary embodiment of the inventive concept.

FIG. 4 is a schematic cross-sectional view taken along line IV-IV' of FIG. 3 according to an exemplary embodiment of the inventive concept.

An enlarged and detailed view of a part of the non-display area NDA including the fan-out lines 165 of the organic light-emitting display apparatus according to an exemplary embodiment is illustrated in FIG. 4.

Referring to FIGS. 3 and 4, the fan-out lines 165 included in the line unit 300 may be disposed in the fan-out area FA of the substrate 100. According to exemplary embodiments, the line unit 300 may be directly disposed on the substrate 100, or various layers may be disposed between the substrate 100 and the line unit 300. For example, at least one of a buffer layer (see 110 of FIG. 5), a gate insulating film (see 130 of FIG. 5), and an interlayer insulating film (see 150 of FIG. 5) may be disposed between the substrate 100 and the line unit 300. For convenience of explanation, the line unit 300 is illustrated as being directly disposed on the substrate 100. However, as described above, exemplary embodiments are not limited thereto.

According to exemplary embodiments, the second insulating film 185 is disposed on the fan-out lines 165. Further, according to exemplary embodiments, the second insulating film 185 is disposed on the line unit 300, covers the fan-out lines 165, and exposes the one end 165a of the fan-out lines 165. The second insulating film 185 may include the same material as that of the pixel-defining layer 180 formed in the display area DA, which will be described further below. Thus, the second insulating film 185 may be patterned after being formed on the entire substrate 100 over the display area DA and the non-display area NDA. The second insulating film 185 may be formed of an organic insulating material and may insulate the line unit 300 from the outside.

The metal layer 215 may be disposed between the line unit 300 and the second insulating film 185. The metal layer 215 may be directly disposed on the fan-out lines 165 to contact the fan-out lines 165. The metal layer 165 may not be connected to any lines or devices, and may be disposed on the fan-out lines 165 in an island shape, as described above. The metal layer 215 may be directly disposed on the fan-out lines 165, which may increase thicknesses of the fan-out lines 165, thereby reducing the resistance of the fan-out lines 165 of the line unit 300 that are designed to have small widths. The metal layer 215 may include the same material as that of the pixel electrode 210 formed in the display area DA, which will be described further below.

The first insulating film 175 may be disposed in the surrounding area SA of the substrate 100. According to exemplary embodiments, the first insulating film 175 may be directly disposed on the substrate 100, or various layers may be disposed between the substrate 100 and the first insulating film 175. For example, at least one of the buffer layer 110, the gate insulating film 130, and the interlayer insulating film 150 may be disposed between the substrate 100 and the first insulating film 175. For convenience of explanation, the first insulating film 175 is illustrated as being directly disposed on the substrate 100. However, as described above, exemplary embodiments are not limited thereto.

The first insulating film 175 may be disposed in the non-display area NDA in a portion that excludes the fan-out area FA and the pad area PA. For example, the first insulating film 175 may be disposed in the surrounding area SA of the non-display area NDA. That is, in an exemplary embodiment, the first insulating film 175 may be formed in an entirety of the non-display area excluding the fan-out area FA and the pad area PA. The first insulting film 175 may include the same material as that of the planarization layer 170 formed in the display area DA, which will be described further below. Thus, the first insulating film 175 may be patterned after being formed on the entire substrate 100 over the display area DA and the non-display area NDA. The first insulating film 175 may be formed of an organic insulating material and may insulate various structures disposed in the surrounding area SA from the outside.

Referring to a comparative example, the non-display area NDA is formed by patterning a same insulating film formed during one process in the fan-out area FA and the surrounding area SA. In general, in the comparative example, the gate electrode 140, the source electrode 160, or the drain electrode 162 of the thin film transistor TFT may be used to form the line unit 300 of the fan-out area FA, and the planarization layer 170 disposed on the thin film transistor TFT may be used to dispose an insulating film in the fan-out area FA and the surrounding area SA. The insulating film is patterned to expose the one end 165a of the fan-out lines 165, and as a result, a step groove 169 may be formed between an edge of the insulating film and the fan-out lines 165. After the insulating film is formed, a process of coating a material forming the pixel electrode 210 on the insulating film and etching the material forming the pixel electrode 210 formed in the non-display area 210 is performed. In this case, metal having a relatively high reduction may be reduced by the galvanic effect due to a reduction difference between metal forming the line unit 300 and metal forming the pixel electrode 210. In this case, reduced metal particles are collected in the step groove 169 between the edge of the insulating film and the fan-out lines 165. The metal particles may cause a short defect between adjacent lines if a voltage is applied to the fan-out lines 165. Moreover, the fan-out lines 165 are designed to have very small gaps between the adjacent fan-out lines 165, and thus, the fan-out lines 165a are vulnerable to this occurring.

In this regard, according to exemplary embodiments of the inventive concept, the organic light-emitting display apparatus removes a step caused by the insulating film during a process of disposing the first insulating film 175 in the surrounding area SA and the second insulating film 185 in the fan-out area FA and etching the material forming the pixel electrode 210, thereby preventing the reduced metal particles from being collected in the step groove 169 between the edge of the insulating film and the fan-out lines 165. As a result, the short defect between adjacent lines may be substantially reduced. According to exemplary embodiments, the metal layer 215 may be directly formed on each of the fan-out lines 165, thereby increasing thicknesses of the lines. Accordingly, the resistance of the fan-out lines 165 of the line unit 300, which are designed to have small widths, may be reduced.

FIG. 5 is a schematic cross-sectional view of a part of the display area DA of FIG. 1 according to an exemplary embodiment of the inventive concept.

Referring to FIGS. 1 and 5, the plurality of pixels PX may be disposed in a display area DA of the organic light-emitting display apparatus according to an exemplary embodiment. Each of the pixels PX may include the thin film transistor TFT and the organic light-emitting device OLED 200 electrically connected to the thin film transistor TFT. The thin film transistor TFT may include a semiconductor layer 120 including, for example, amorphous silicon, polycrystalline silicon, or an organic semiconductor material, the gate electrode 140, the source electrode 160, and the drain electrode 162. The organic light-emitting device OLED 200 may include the pixel electrode 210, an intermediate layer 220 including, for example, an emission layer (EML), and an opposite electrode 230. Hereinafter, general configurations of the thin film transistor TFT and the organic light-emitting device OLED 200 will be described in detail.

The buffer layer 110, which may be formed of silicon oxide or silicon nitride, may be disposed on the substrate 100 so as to planarize a surface of the substrate 100 or prevent impurities from penetrating into the semiconductor layer 120 of the thin film transistor TFT. The semiconductor layer 120 may be disposed on the buffer layer 110.

The gate electrode 140 may be disposed on the semiconductor layer 120. The source electrode 160 and the drain electrode 162 may be electrically connected to each other according to a signal applied to the gate electrode 140. The gate electrode 140 may be formed as a single layer or multiple layers and formed of, for example, one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) by taking into account, for example, the adhesiveness to a layer adjacent thereto, a surface flatness of a stacked layer stacked on the gate electrode 140, and processability.

In this regard, to secure insulation between the semiconductor layer 120 and the gate electrode 140, the gate insulation layer 130, which may be formed of silicon oxide and/or silicon nitride, may be disposed between the semiconductor layer 120 and the gate electrode 140.

The interlayer insulation layer 150 may be disposed on the gate electrode. The interlayer insulation layer 150 may be formed as a single layer or multiple layers and formed of a material such as, for example, silicon oxide or silicon nitride.

The source electrode 160 and the drain electrode 162 may be disposed on the interlayer insulation layer 150. The source electrode 160 and the drain electrode 162 may be electrically connected to the semiconductor layer 120 through a contact hole which is formed in the interlayer insulation layer 150 and the gate insulation layer 130. The source electrode 160 and the drain electrode 162 may be formed as a single layer or multiple layers. The source electrode 160 and the drain electrode 162 may formed of, for example, one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) by taking into account, for example, conductivity.

The line unit 300 may be formed in the fan-out area FA of the non-display area NDA simultaneously with a process of forming the thin film transistor TFT of the display area DA. That is, the line unit 300 may be formed in the fan-out area FA of the non-display area NDA at substantially the same time as forming the thin film transistor TFT in the display area DA. Thus, the line unit 300 may be formed of the same material as that of the gate electrode 140, the source electrode 160, or the drain electrode 162 of the thin film transistor TFT.

A protection film may be disposed to cover the thin film transistor TFT so as to protect the thin film transistor TFT having the above-described structure. The protection film may be formed of, for example, an inorganic material such as silicon oxide, silicon nitride, or silicon oxynitride. However, the protection film is not limited thereto.

The planarization layer 170 may be disposed on the substrate 100. The planarization layer 170 may generally planarize a top surface of the thin film transistor TFT and protect the thin film transistor TFT and various devices when the organic light-emitting device OLED 200 is disposed on the thin film transistor TFT. The planarization layer 170 may be formed of, for example, an acryl-based organic material or benzocyclobutene (BCB). In this regard, as illustrated in FIG. 5, the buffer layer 110, the gate insulation film 130, the interlayer insulation film 150, and the planarization layer 170 may be formed on the entire substrate 100.

As described above, the first insulating film 175 may be formed in the surrounding area SA of the non-display area NDA simultaneously with (e.g., at substantially the same time as) a process of forming the planarization layer 170 of the display area DA. Thus, the first insulating film 175 may be formed of the same material as that of the above-described planarization layer 170.

The pixel-defining layer 180 may be disposed on the thin film transistor TFT. The pixel-defining layer 180 may be disposed on the above-described planarization layer 170 and may have an opening. The pixel-defining layer 180 may define a pixel area on the substrate 100.

The pixel-defining layer 180 may be provided as, for example, an organic insulation layer. The organic insulation layer may include an acryl-based polymer such as, for example, poly(methyl methacrylate) (PMMA), polystyrene (PS), polymer derivatives containing a phenol group, an imide-based polymer, an aryl ether-based polymer, an amide-based polymer, a fluorine-based polymer, a p-xylene-based polymer, a vinyl alcohol-based polymer, and a compound thereof. However, the organic insulation layer is not limited thereto.

As described above, the second insulating film 185 may be formed in the fan-out area FA of the non-display area NDA simultaneously with (e.g., at substantially the same time as) a process of forming the pixel-defining layer 180 of the display area DA. Thus, the second insulating film 185 may be formed of the same material as that of the pixel-defining layer 180.

The organic light-emitting device OLED 200 may be disposed on the pixel-defining layer 180. The organic light-emitting device OLED 200 may include the pixel electrode 210, the intermediate layer 220 including the EML, and the opposite electrode 230.

The pixel electrode 210 may be formed as, for example, a (semi)transparent electrode or a reflective electrode. When the pixel electrode 210 is formed as a (semi)transparent electrode, the pixel electrode 210 may be formed of, for example, indium tin oxide (ITO), indium zinc oxide (IZO), zinc oxide (ZnO), indium oxide ($In_2O_3$), indium gallium oxide (IGO), and aluminum zinc oxide (AZO). When the pixel electrode 210 is formed as a reflective electrode, the pixel electrode 210 may include a reflective layer formed of Ag, Mg, Al, Pt, Pd, Au, Ni, Nd, Ir, Cr, and a compound thereof, and a layer formed of ITO, IZO, ZnO, $In_2O_3$, IGO, or AZO. However, exemplary embodiments of the present inventive concept are not limited thereto. For example, the pixel electrode 210 may be formed of various materials. Further, a structure of the pixel electrode 210 may include a single layer or multiple layers through various modifications.

As described above, the metal layer 215 may be formed on each of the fan-out lines 165 in the non-display area NDA simultaneously with (e.g., at substantially the same time as) a process of forming the pixel electrode 210 of the display area DA. Thus, the metal layer 215 may be formed of the same material as that of the pixel electrode 210.

The intermediate layer 220 may be disposed in the pixel area defined by the pixel-defining layer 180. The intermediate layer 220 may include the EML that emits light according to an electrical signal. In addition to the EML, a hole injection layer (HIL) disposed between the EML and the pixel electrode 210, an electron transport layer (ETL) disposed between the opposite electrode 230 and the HTL and EML, and an electron injection layer (EIL) may be stacked and formed in a single or complex structure. However, the intermediate layer 220 is not limited thereto, and may have various structures.

The intermediate layer 220 may be formed of a low-molecular weight organic material or a polymer organic material.

When the intermediate layer 220 includes a low-molecular weight organic material, an HTL, an HIL, an ETL, and an EIL may be stacked with respect to the EML. In addition, various other layers may be stacked. The intermediate layer 220 may use, as an available organic material, various materials such as, for example, copper phthalocyanine (CuPc), N,N'-Di(naphthalene-1-yl)-N,N'-diphenyl-benzidine (NPB), and tris-8-hydroxyquinoline aluminum (Alq3).

When the intermediate layer 220 includes a polymer organic material, an HTL in addition to the intermediate layer 220 may be provided. The HTL may use poly-(2,4)-ethylene-dihydroxy thiophene (PEDOT) or polyaniline (PANI). In this case, the intermediate layer 220 may use, as an available organic material, polymer organic materials such as, for example, a poly (p-phenylene vinylene) (PPV)-based polymer material and a polyfluorene-based polymer material. Further, an inorganic material may be provided between the intermediate layer 220 and the pixel electrode 210 and the opposite electrode 230.

In this case, the HTL, the HIL, the ETL, and the EIL may be integrally formed on the entire substrate 100. In an exemplary embodiment, only the EML may be formed in each pixel in an inkjet printing process. Even in this case, the HTL, the HIL, the ETL, and the EIL may be disposed in a recessed portion.

The opposite electrode 230, which covers the intermediate layer 220 including the EML and is opposite to the pixel electrode 210, may be disposed on the entire substrate 100. The opposite electrode 230 may be formed as, for example, a (semi)transparent electrode or a reflective electrode.

When the opposite electrode 230 is formed as a (semi) transparent electrode, the opposite electrode 230 may include, for example, a layer formed of metal (e.g., Li, Ca, LiF/Ca, LiF/Al, Al, Ag, Mg, and a compound thereof) having a small work function and a (semi)transparent conductive layer formed of ITO, IZO, ZnO, or $In_2O_3$. When the opposite electrode 230 is formed as a reflective electrode, the opposite electrode 230 may include, for example, a layer formed of Li, Ca, LiF/Ca, LiF/Al, Al, Ag, Mg, and a compound thereof. However, the structure and material of the opposite electrode 230 are not limited thereto, and may be variously modified.

FIGS. 6A through 8B are schematic cross-sectional views illustrating a method of manufacturing the organic light-emitting display apparatus of FIG. 4, according to an exemplary embodiment of the inventive concept.

Referring to FIGS. 6A through 8B, the substrate 100 of an exemplary embodiment may include the non-display area NDA including the pad area PA formed in a center portion, the fan-out area FA disposed at an opposite side to a side in which the display area DA is disposed with respect to the pad area PA, and the surrounding area SA excluding the pad area PA and the fan-out area FA. The display area DA may be formed on a large part of the substrate 100, and the non-display area NDA may be disposed at one side of the display area DA.

Figure 6A:
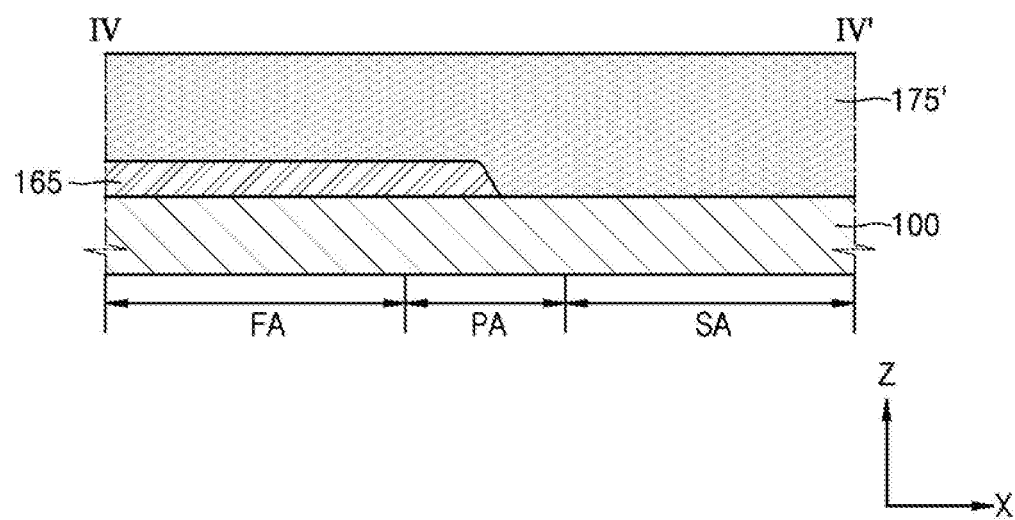
FIGS. 6A through 8B are schematic cross-sectional views illustrating a method of manufacturing the organic light-emitting display apparatus of FIG. 4 according to an exemplary embodiment of the inventive concept.
Figure 6B:
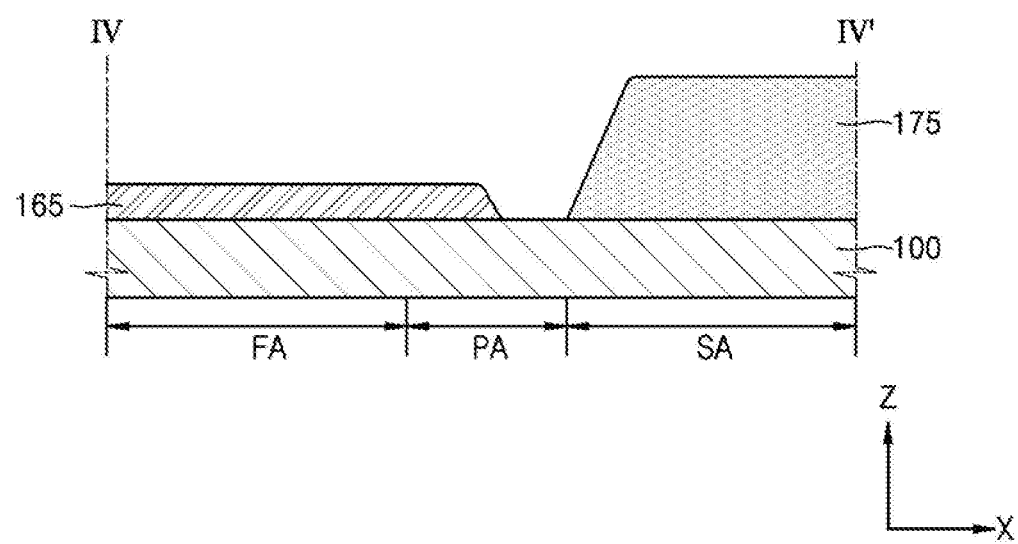

Referring to FIGS. 6A and 6B, an operation of forming the fan-out lines 165 on the substrate 100 may be performed as shown in FIG. 6A. For example, the fan-out lines 165 may be disposed in the fan-out area FA of the non-display area NDA. The one end 165a of the fan-out lines 165 may extend to the pad area PA. Referring to FIG. 2, the first pad unit 163 may be formed at one end of the fan-out lines 165.

Although the fan-out lines 165 are illustrated as being directly formed on the substrate 100 in FIGS. 6A through 8B, exemplary embodiments are not limited thereto. For example, according to exemplary embodiments, various layers may be disposed between the substrate 100 and the fan-out lines 165. For example, at least one of the buffer layer 110, the gate insulating film 130, and the interlayer insulating film 150 may be disposed between the substrate 100 and the fan-out lines 165.

As described above, the fan-out lines 165 may be formed simultaneously with (e.g., at substantially the same time as) a process of forming the thin film transistor TFT in the display area DA. That is, the fan-out lines 165 may be formed at substantially the same time as a process of forming the gate electrode 140, the source electrode 160, or the drain electrode 162 of the thin film transistor TFT.

Thereafter, an operation of coating a first insulating material layer 175' on the fan-out lines 165 may be performed. The first insulating material layer 175' may include the same material as that of the planarization layer 170 disposed in the display area DA. Thus, the operation of coating the first insulating material layer 175' may be performed simultaneously with (e.g., at substantially the same time as) an operation of forming the planarization layer 170. The first insulating material layer 175' may include an organic insulating material and may be formed of, for example, an acryl-based organic material or benzocyclobutene (BCB). In an exemplary embodiment, the planarization layer 170 is formed subsequent to forming the thin film transistor TFT and prior to forming the pixel electrode 210.

Thereafter, as shown in FIG. 6B, an operation of patterning and partially etching the first insulating material layer 175' may be performed. That is, the first insulating material layer 175' that is coated on the entire surface of the substrate 100 and formed in the pad area PA and the fan-out area FA may be removed. Thus, the first insulating film 175 may be disposed in the surrounding area SA, and the fan-out lines 165 may be exposed through the first insulating film 175.

In a comparative example, when the first insulating film 175 is formed on the fan-out lines 165, a step groove may be formed between the fan-out lines 165 and the first insulating film 175. Further, metal ions generated by etching may be reduced by a reduction difference between the metal ions and metal materials forming the fan-out lines 165 in an operation of forming the metal layer 215, which will be described further below. As a result, metal particles may be collected in the step groove of the previously formed fan-out lines 165 and the first insulating film 175, which may cause a short between adjacent lines.

According to exemplary embodiments of the inventive concept, the first insulating material layer 175' formed on the fan-out lines 165 may be removed as described above, thereby preventing the metal ions from being reduced and collected in a step portion during a manufacturing process.

Figure 7A:
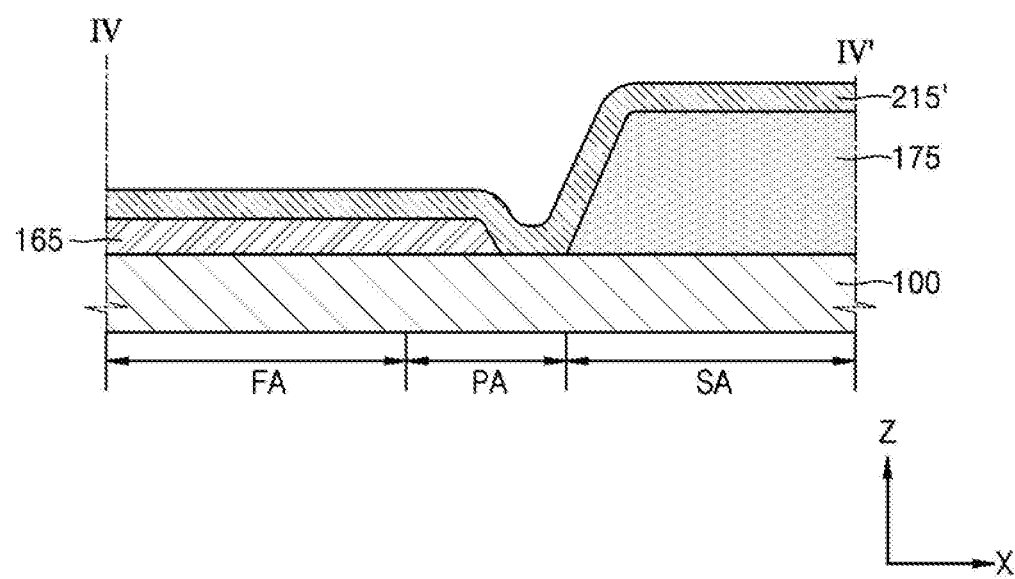
Figure 7B:
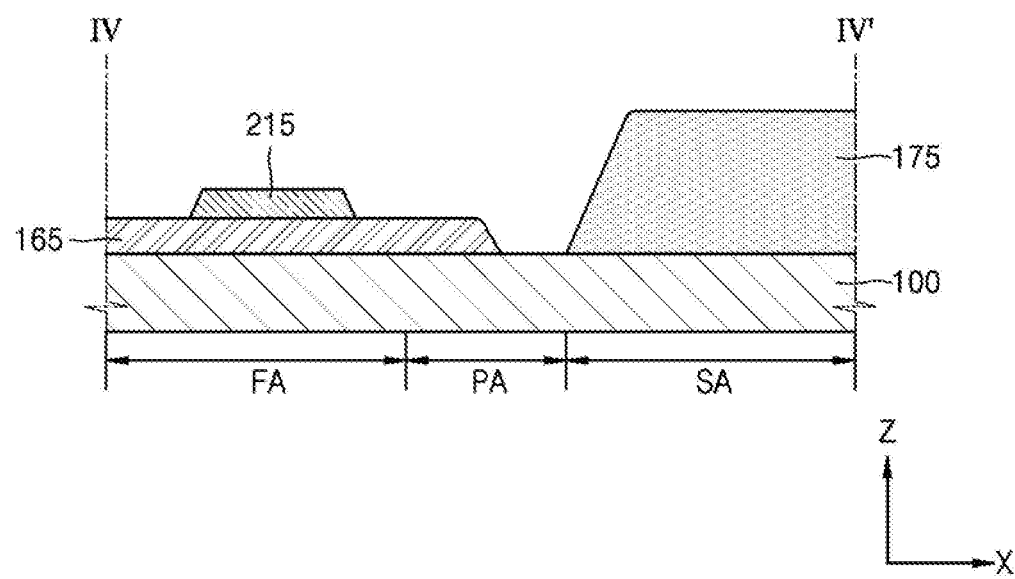

Referring to FIGS. 7A and 7B, an operation of forming the metal layer 215 on each of the fan-out lines 165 may be performed.

As shown in FIG. 7A, a metal material layer 215' may be coated on the substrate 100 in the non-display area NDA. The metal material layer 215' may be formed simultaneously with (e.g., at substantially the same time as) a process of forming the pixel electrode 215 of the display area DA. That is, the metal layer 215 may be formed simultaneously with (e.g., at substantially the same time as) the pixel electrode 215 of the organic light-emitting device OLED 200. Thus, the metal layer 215 may include the same material as that of the pixel electrode 210. For example, the metal layer 215 may include a reflective layer formed of Ag, Mg, Al, Pt, Pd, Au, Ni, Nd, Ir, Cr, and a compound thereof, and a layer formed of ITO, IZO, ZnO, In$_2$O$_3$, IGO, or AZO, and may be formed as a single layer or multiple layers.

Thereafter, as shown in FIG. 7B, an operation of forming the metal layer 215 by patterning the metal material layer 215' coated on the substrate 100 in the non-display area NDA may be performed. That is, the metal layer 215 may be formed by retaining only a part of the metal material layer 215' disposed on each of the fan-out lines 165 and removing a remaining part thereof. An etchant that corrodes metal may be used in a process of removing the metal material layer 215'.

This process may be described with reference to an example in which a line layer is formed as a complex layer of Ti/Al/Ti and the metal layer 215 includes Ag. As described above, Ag may be ionized by the etchant during the process of removing the metal material layer 215'. In this regard, the galvanic effect may be produced by the meeting of Ag+ ions and dissimilar metals included in the lower line layer. Thus, the Ag+ ions may be reduced to form Ag particles. The Ag particles are collected in a step groove of a lower layer structure. Thus, to prevent the Ag particles from being collected in the step groove of the lower layer structure, in exemplary embodiments, after removing the first insulating film 175 formed on the fan-out lines 165 before the metal layer 215, the fan-out lines 165 may be covered with the second insulating film 185 formed after the metal layer 215. As a result, the metal particles generated during the etching of the metal layer 215 may be prevented from being collected in the step groove, thereby reducing a short defect between adjacent lines.

The metal layer 215 may be formed on each of the fan-out lines 165 in an island shape and may not be connected to any devices or lines. As described above, the metal layer 215 may be directly disposed on the fan-out lines 165, which may increase thicknesses of the fan-out lines 165, thereby reducing the resistance of the fan-out lines 165 of the line unit 300, which are designed to have small widths. The metal layer 215 may include the same material as that of the pixel electrode 210 formed in the display area DA.

Figure 8A:
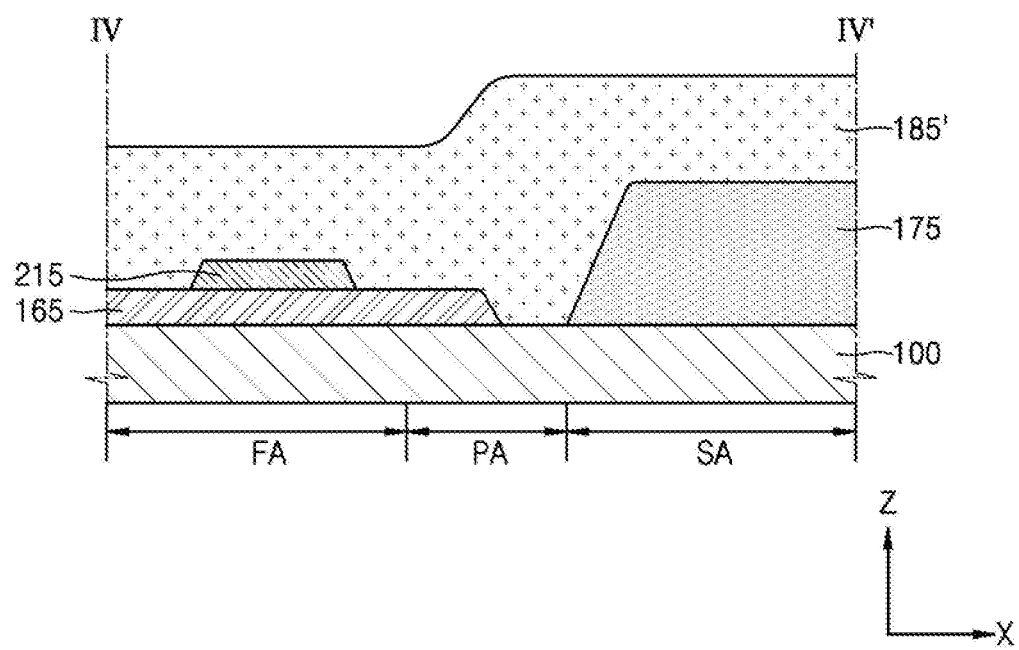
Figure 8B:
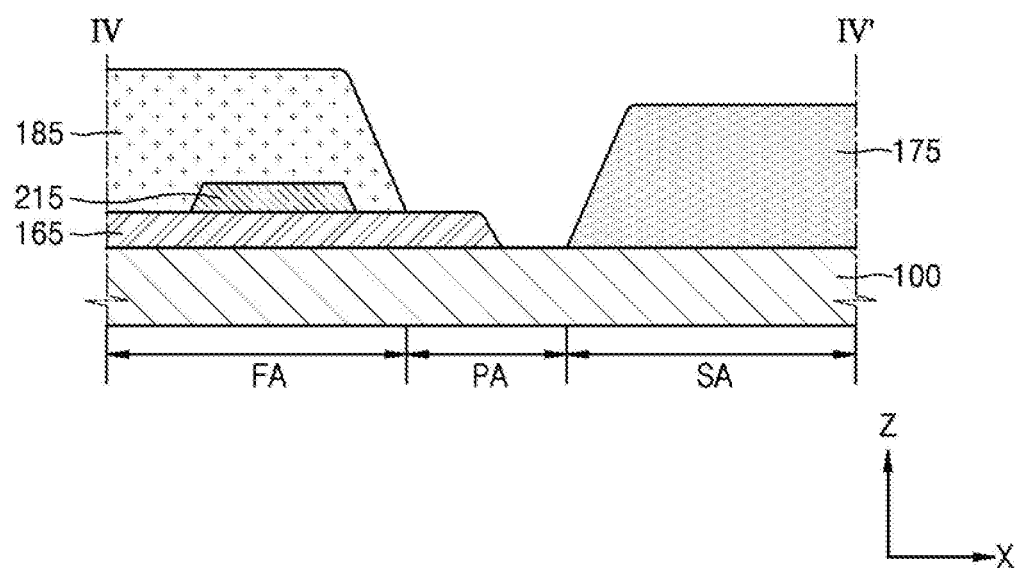

Referring to FIGS. 8A and 8B, an operation of forming the second insulating film 185 on the metal layer 215 to cover the fan-out lines 165 and expose the one end 165a of the fan-out lines 165 on the fan-out area FA may be performed.

As shown in FIG. 8A, an operation of coating a second insulating material layer 185' on the substrate 100 in the non-display area NDA to cover the metal layer 215, the fan-out lines 165, and the first insulating film 175 may be performed. The second insulating material layer 185' may be formed simultaneously with (e.g., at substantially the same time as) the pixel-defining layer 180 of the display area DA. Thus, the second insulating material layer 185' may include the same material as that of the pixel-defining layer 180. Thus, the second insulating material layer 185' may include an organic insulating material. For example, the organic insulating material may include an acryl-based polymer such as, for example, poly(methyl methacrylate) (PMMA), polystyrene (PS), polymer derivatives containing a phenol group, an imide-based polymer, an aryl ether-based polymer, an amide-based polymer, a fluorine-based polymer, a p-xylene-based polymer, a vinyl alcohol-based polymer, and a compound thereof.

Thereafter, as shown in FIG. 8B, an operation of removing the second insulating material layer 185' coated on the substrate 100 in the surrounding area SA and the pad area PA may be performed. During this process, the one end 165a of the fan-out lines 165 extending onto the pad area PA may be exposed to the outside by the second insulating film 185.

As described above, the organic light-emitting display apparatus according to exemplary embodiments of the inventive concept may remove a step due to an insulating film provided on the fan-out lines 165 during a process of etching a material forming the pixel electrode 210 by disposing the first insulating film 175 in the surrounding area SA and disposing the second insulating film 185 in the fan-out area FA, thereby reducing the occurrence of metal particles from being collected in the step groove 169 between an edge of the insulating film and the fan-out lines 165. Thus, a short defect between adjacent lines may be substantially reduced. The metal layer 215 may be directly formed on each of the fan-out lines 165, thereby increasing thicknesses of lines. Accordingly, the resistance of the fan-out lines 165 of the line unit 300, which are designed to have small widths, may be reduced.

As described above, according to exemplary embodiments of the inventive concept, an organic light-emitting display apparatus with a minimized short defect between adjacent fan-out lines and a method of manufacturing the same are provided.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An organic light-emitting display apparatus, comprising:
  a substrate comprising a display area and a non-display area;
  a line unit comprising a plurality of lines and disposed on the substrate in the non-display area;
  an insulating film disposed on the line unit and exposing one end of the line unit; and
  a metal layer disposed between the line unit and the insulating film.

2. The organic light-emitting display apparatus of claim 1, wherein the metal layer is disposed on each of the plurality of lines in an island shape.

3. The organic light-emitting display apparatus of claim 1, further comprising:
  a first pad unit disposed on the line unit and a second pad unit disposed on the line unit.

4. The organic light-emitting display apparatus of claim 3, wherein the first pad unit is electrically connected to a driving circuit chip, and the second pad unit is electrically connected to a flexible printed circuit board.

5. The organic light-emitting display apparatus of claim 1, wherein the insulating film comprises organic insulating material.

6. The organic light-emitting display apparatus of claim 1, further comprising:
  a thin film transistor disposed on the substrate in the display area; and a pixel electrode electrically connected to the thin film transistor, wherein the metal layer and the pixel electrode comprise same material.

7. The organic light-emitting display apparatus of claim 6, further comprising:
   a pixel-defining layer covering the pixel electrode and exposing a center portion of the pixel electrode,
   wherein the insulating film and the pixel-defining layer comprise same material.

8. An organic light-emitting display apparatus, comprising:
   a substrate comprising a display area, a non-display area, a pad area formed in a center portion of the non-display area, and a fan-out area disposed in the non-display area, wherein the pad area is disposed between the display area and the fan-out area;
   a line unit comprising a plurality of lines disposed on the substrate in the fan-out area;
   a first insulating film disposed in a portion of the non-display area that excludes the fan-out area and the pad area; and
   a second insulating film disposed on the line unit and exposing one end of the line unit.

9. The organic light-emitting display apparatus of claim 8, further comprising:
   a metal layer disposed between the line unit and the second insulating film.

10. The organic light-emitting display apparatus of claim 9, wherein the metal layer is disposed on each of the plurality of lines in an island shape.

11. The organic light-emitting display apparatus of claim 9, further comprising:
    a thin film transistor disposed on the substrate in the display area; and
    a pixel electrode electrically connected to the thin film transistor,
    wherein the metal layer and the pixel electrode comprise same material.

12. The organic light-emitting display apparatus of claim 11, further comprising:
    a pixel-defining layer covering the pixel electrode and exposing a center portion of the pixel electrode,
    wherein the second insulating film and the pixel-defining layer comprise same material.

13. The organic light-emitting display apparatus of claim 11, further comprising:
    a planarization layer disposed between the thin film transistor and the pixel electrode,
    wherein the first insulating film and the planarization layer comprise same material.

14. The organic light-emitting display apparatus of claim 11, wherein the thin film transistor comprises a semiconductor layer, a gate electrode, a source electrode, and a drain electrode, and the line unit and the drain electrode or the source electrode comprise same material.

15. The organic light-emitting display apparatus of claim 8, further comprising:
    a first pad unit disposed on the one end of the line unit and a second pad unit disposed on another end of the line unit.

16. The organic light-emitting display apparatus of claim 15, wherein the first pad unit is electrically connected to a driving circuit chip, and the second pad unit is electrically connected to a flexible printed circuit board.

17. The organic light-emitting display apparatus of claim 8, wherein the first and second insulating films comprise an organic insulating material.

18. A method of manufacturing an organic light-emitting display apparatus, comprising:
    forming a plurality of lines on a substrate in a fan-out area of the substrate, wherein the substrate comprises a display area, a non-display area, the fan-out area disposed in the non-display area, a pad area formed in a center portion of the non-display area and disposed between the display area and the fan-out area, and a surrounding area disposed in a portion of the non-display area that excludes the pad area and the fan-out area;
    forming a first insulating film on the substrate in the surrounding area, wherein the plurality of lines formed in the fan-out area is exposed from the first insulating layer;
    forming a metal layer on each of the plurality of lines; and
    forming a second insulating film on the metal layer, wherein the second insulating film covers the plurality of lines and exposes one end of each of the plurality of lines in the pad area.

19. The method of claim 18, wherein forming the first insulating film comprises:
    coating a first insulating material layer on the substrate; and
    removing the first insulating material layer formed in the pad area and the fan-out area.

20. The method of claim 18, wherein forming the metal layer comprises:
    forming the metal layer on each of the plurality of lines in an island shape.

21. The method of claim 18, wherein forming the second insulating film comprises:
    coating a second insulating material layer on the substrate covering the metal layer, the plurality of lines, and the first insulating film; and
    removing the second insulating material layer formed in the pad area and the surrounding area.

22. The method of claim 18, further comprising:
    forming a thin film transistor in the display area; and
    forming a pixel electrode electrically connected to the thin film transistor,
    wherein forming the metal layer is performed at substantially a same time as forming the pixel electrode.

23. The method of claim 22, further comprising:
    forming a pixel-defining layer covering the pixel electrode and exposing a center portion of the pixel electrode,
    wherein forming the second insulating film is performed at substantially a same time as forming the pixel-defining layer.

24. The method of claim 22, further comprising:
    forming a planarization layer subsequent to forming the thin film transistor and prior to forming the pixel electrode,
    wherein forming the first insulating film is performed at substantially a same time as forming the planarization layer.

25. The method of claim 22, wherein forming the thin film transistor comprises:
    forming a semiconductor layer;
    forming a gate electrode; and
    forming a source electrode and a drain electrode electrically connected to the semiconductor layer, wherein forming the plurality of lines is performed at substantially a same time as forming the source electrode or the drain electrode.

26. The method of claim 18, further comprising:
connecting the one end of each of the plurality of lines to a driving circuit chip; and
connecting another end of each of the plurality of lines to a flexible printed circuit board.

27. The method of claim 18, wherein the first and second insulating films comprise an organic insulating material.

28. A method of manufacturing an organic light-emitting display apparatus, comprising:
forming a line unit comprising a plurality of lines in a non-display area of a substrate, wherein the substrate comprises a display area and the non-display area;
forming an insulating film on the line unit, wherein the insulating film exposes one end of the line unit; and
forming a metal layer disposed between the line unit and the insulating film.

29. The method of claim 28, further comprising:
forming a thin film transistor on the substrate in the display area; and
forming a pixel electrode electrically connected to the thin film transistor,
wherein the metal layer and the pixel electrode comprise a same material.

30. The method of claim 29, further comprising:
forming a pixel-defining layer, wherein the pixel-defining layer covers an edge of the pixel electrode and exposes a center portion of the pixel electrode,
wherein the insulating film and the pixel-defining layer comprise a same material.

* * * * *